(12) United States Patent
Abe

(10) Patent No.: US 10,256,184 B2
(45) Date of Patent: Apr. 9, 2019

(54) SEMICONDUCTOR DEVICE AND MANUFACTURING METHOD THEREOF

(71) Applicant: Lapis Semiconductor Co., Ltd., Yokohama (JP)

(72) Inventor: Kazuhide Abe, Tokyo (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 14/484,414

(22) Filed: Sep. 12, 2014

(65) Prior Publication Data

US 2014/0374910 A1    Dec. 25, 2014

Related U.S. Application Data

(60) Continuation of application No. 12/170,458, filed on Jul. 10, 2008, now Pat. No. 8,859,426, which is a (Continued)

(30) Foreign Application Priority Data

Jan. 14, 2004   (JP) .................................. 2004-006546

(51) Int. Cl.
*H01L 23/522*   (2006.01)
*H01L 21/288*   (2006.01)
(Continued)

(52) U.S. Cl.
CPC ...... *H01L 23/5226* (2013.01); *H01L 21/2885* (2013.01); *H01L 21/31116* (2013.01); *H01L 21/3212* (2013.01); *H01L 21/32135* (2013.01); *H01L 21/32136* (2013.01); *H01L 21/76801* (2013.01); *H01L 21/76802* (2013.01); *H01L 21/76807* (2013.01); *H01L 21/76831* (2013.01); *H01L 21/76834* (2013.01); *H01L 21/76844* (2013.01); *H01L 21/76849* (2013.01); *H01L 21/76852* (2013.01); *H01L 21/76865* (2013.01); *H01L 21/76877* (2013.01); *H01L 23/53233* (2013.01); *H01L 23/53238* (2013.01); *H01L 23/53295* (2013.01); *H01L 2924/0002* (2013.01)

(58) Field of Classification Search
None
See application file for complete search history.

(56) References Cited

U.S. PATENT DOCUMENTS 5,084,413 A    1/1992   Fujita et al.
RE34,583 E     4/1994   Grief et al.
(Continued)

FOREIGN PATENT DOCUMENTS

JP         2002329780         11/2002

*Primary Examiner* — Long Pham
(74) *Attorney, Agent, or Firm* — Volentine, Whitt & Francos, PLLC

(57) ABSTRACT

A semiconductor device has a semiconductor substrate, a first insulating film formed on a surface of the semiconductor substrate, a first recess formed in the first insulating film, a first barrier film formed on an inner surface of the first insulating film except a top peripheral region of the first trench, a first conductive film formed in the first trench, and a covering film formed on an upper surface and a top peripheral region of the first conductive film and an upper surface of the first barrier film. The first conductive film includes copper.

12 Claims, 15 Drawing Sheets

Related U.S. Application Data division of application No. 10/910,318, filed on Aug. 4, 2004, now Pat. No. 7,414,314.

(51) Int. Cl.
| | |
|---|---|
| *H01L 21/311* | (2006.01) |
| *H01L 21/321* | (2006.01) |
| *H01L 21/3213* | (2006.01) |
| *H01L 21/768* | (2006.01) |
| *H01L 23/532* | (2006.01) |

(56) References Cited

U.S. PATENT DOCUMENTS

| | | |
|---|---|---|
| 5,358,621 A | 10/1994 | Oyama |
| 5,374,849 A | 12/1994 | Tada |
| 5,387,550 A | 2/1995 | Cheffings et al. |
| 5,427,981 A | 6/1995 | Choi |
| 5,484,747 A | 1/1996 | Chien |
| 5,817,573 A | 10/1998 | Rhodes et al. |
| 5,907,787 A | 5/1999 | Sato |
| 5,960,314 A | 9/1999 | Rhodes et al. |
| 6,521,531 B2 | 2/2003 | Yoshizawa |
| 2003/0111730 A1* | 6/2003 | Takeda .............. H01L 21/76801 257/758 |
| 2004/0188839 A1* | 9/2004 | Ohtsuka ............ H01L 21/76807 257/750 |
| 2005/0009339 A1 | 1/2005 | Park |
| 2006/0255463 A1* | 11/2006 | Won ................. H01L 23/53238 257/751 |

* cited by examiner

SEMICONDUCTOR DEVICE AND MANUFACTURING METHOD THEREOF

CROSS-REFERENCE TO RELATED APPLICATIONS

This application is a continuation application of application Ser. No. 12/170,458 filed on Jul. 10, 2008, now U.S. Pat. No. 8,859,426, which is a divisional application of application Ser. No. 10/910,318 filed on Aug. 4, 2004, now U.S. Pat. No. 7,414,314, which are hereby incorporated for all purposes.

BACKGROUND OF THE INVENTION

1. Field of the Invention

The present invention relates to a wirings structure of a semiconductor device, in particular, including wirings embedded in a vicinity of a surface of an insulating layer. This is a counterpart of and claims priority to Japanese Patent Application No. 2004-6546 filed on Jan. 14, 2004, which is herein incorporated by reference.

2. Description of the Related Art

In a conventional method for forming copper wirings of the semiconductor device using damascene process, an insulating layer is formed on a semiconductor substrate and grooves for the wirings are formed in the insulating layer. Barrier layers and a copper wiring film are deposited in the grooves in sequence. The barrier layer prevents copper ions of the copper wiring film from diffusing into the insulating layer. After the above deposition, the copper wiring film and the barrier layers are smoothed by Chemical Mechanical Polishing method so as to be left only in the grooves of the insulating layer, and a covering film is formed on the copper wiring film and the insulating layer. When the covering film is made of insulating material, for example, silicon nitride, an adhesiveness between the covering film and the copper wiring film is low. Therefore, in an upper surface of the copper wiring film that is contact with the covering film, electro-migration easily occurs. As the result, the copper ions diffuse from the upper surface of the copper wiring film into the insulating film. That is, since copper hillocks grow through the interface between the covering film and the copper wiring film, leakage current can occur between adjacent copper wiring films.

To suppress the above leakage current, the wirings structure of the semiconductor device has been proposed as described in Document 1 (Japanese Patent Publication Laid-Open No. 2002-329780). In the wirings structure as described in the Document 1 (in particular, Page 15 and FIG. 20), a plurality of grooves for the wirings are formed in the insulating layer, and the barrier films and the copper wiring films are embedded in the grooves. After that, the surface of the insulating layer is located lower than the upper surfaces of the barrier film and the copper wiring film. A capping film is formed on the copper wiring film, the barrier film and the insulating film. The upper surface of the copper wiring film which is diffusion path of the copper ions is different from a boundary surface between the capping film and the insulating film in height. Thus, the leakage between the adjacent copper wiring films can be suppressed.

However, in the above-mentioned wirings structure of the semiconductor device as described in Document 1, reducing the thickness of the insulating film makes upper portions of the barrier film and the copper wiring film protruded from the surface of the insulating film. Since the area of the thinned insulating film accounts for a certain share of the entire area of wirings structure, the difference in level between the upper surface of the copper wiring film and the upper surface of the insulating film causes a larger step in the multi-level interconnects. Therefore, in the manufacturing method of the semiconductor device as described in Document 1, it is difficult to realize the exact microfabrication. In particular, in the multi-wiring structure, when the number of layers increases, it is difficult to realize the exact microfabrication as in the upper layer.

Therefore, it is necessary that the step between the copper wiring film and the insulating film is reduced and that the insulation performance is improved between the adjacent copper wiring films.

SUMMARY OF THE INVENTION

An object of the present invention is to reduce the step between the copper wiring film and the insulating film and to improve the degree of insulation between the adjacent copper wiring films.

To achieve the object, in the present invention, a semiconductor device has a semiconductor substrate, a first insulating film formed on a surface of the semiconductor substrate, a first trench formed in a vicinity of a surface of the first insulating film, a first barrier film formed on a sidewall of the first insulating film in the first trench, a first wiring film formed in the first trench, and a covering film formed on an upper surface and side surfaces of the first wiring film and an upper surface of the first barrier film. The first wiring film includes copper, and the height of the first wiring film being higher than that of the first barrier film.

According to the present invention, the possibility of the leakage current occurs between the adjacent first wiring films can be decreased.

Furthermore, to achieve the object, in the present invention, a method of manufacturing a semiconductor device comprises preparing a semiconductor substrate, forming a first insulating film on a surface of the semiconductor substrate, forming a first trench in a vicinity of a surface of the first insulating film, forming a first barrier film on a sidewall of the first insulating film in the first trench, forming a first wiring film including copper formed in the first trench so that a height of the first wiring film is higher than a height of the first barrier film; and forming a covering film on an upper surface and side surfaces of the first wiring film and an upper surface of the first barrier film.

According to the present invention, the possibility of the leakage current occurs between the adjacent first wiring films can be decreased.

DETAILED DESCRIPTION OF THE PREFERRED EMBODIMENTS

The present invention will be described hereinafter with references to the accompanying drawings. The drawings used for this description typically illustrate major characteristic parts in order that the present invention will be easily understood.

First Preferred Embodiment

Figure 1:
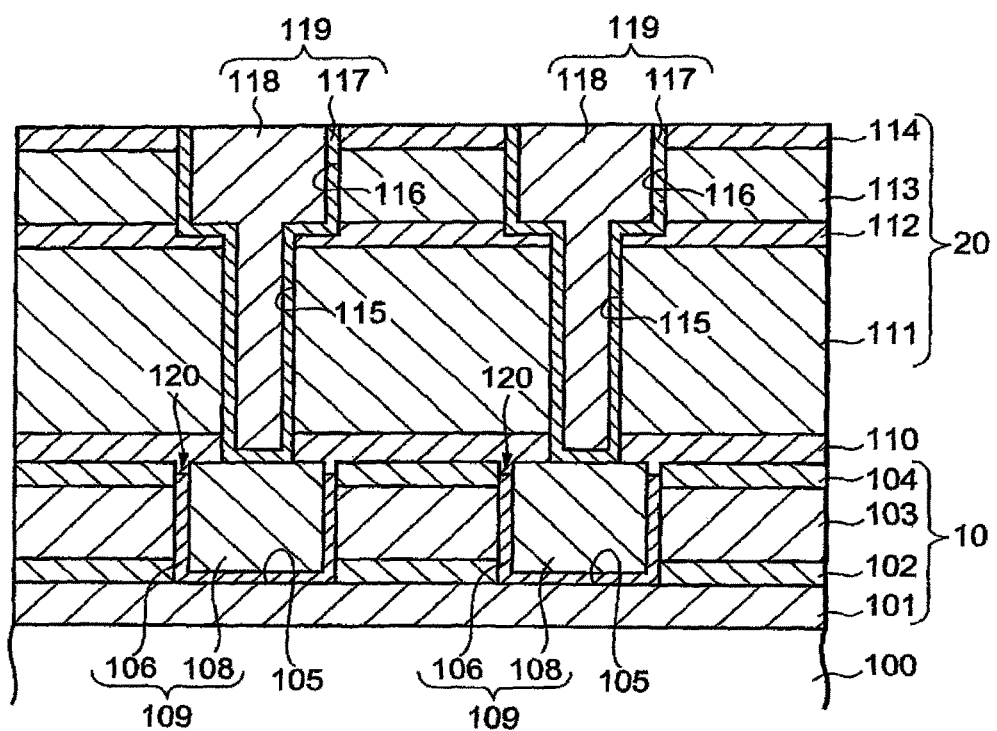
FIG. 1 is a cross sectional view describing a wiring structure of a semiconductor device according to a first preferred embodiment of the present invention.

FIG. 1 is a cross sectional view describing a wirings structure of a semiconductor device according to a first preferred embodiment of the present invention. A first insulating film 10 includes a plurality of insulating films 101-104 and is formed on a semiconductor substrate 100. A plurality of first trenches 105 are formed in the first insulating film 10. A plurality of grooves may be formed in the first insulating film 10 instead of a plurality of the first trenches 105. A portion of an upper surface of the insulating film 101 is exposed from the insulating films 102-104 at the bottom of the first trench 105. A first barrier film 106 is formed on the upper surface of the insulating film 101 and a sidewall of the first insulating films 102-104 in the first trench 105. A position of an upper end portion of the first barrier film 106 is different in height from a position of an upper surface of the first insulating film 104. That is, the upper end portions of the first barrier film 106 are positioned approximately 20 nm-30 nm lower than an upper surface of the insulating film 104 of the first insulating film 10. A first conductive film 108 is formed with itself embedded in the first trench 105 in which the first barrier film 106 is formed. The first conductive film 108 has an upper surface that is positioned approximately 20 nm-30 nm higher than the upper end portions of the first barrier film 106. Therefore, the upper surface of the first conductive film 108 has the substantially same height comparing with an upper surface of the insulating film 104 of the first insulating film 10. The first barrier film 106 and the first conductive film 108 comprise a first conductive layer of wiring 109 of the semiconductor device. Also, as described above, since the upper end portions of the first barrier film 106 are positioned lower than both the upper surface of the first insulating film 10 and the upper surface of the first conductive film 108, a plurality of concave portions 120 are composed of surfaces of the upper end portions of the first barrier film 106 and side surfaces of the insulating film 104 and the first conductive film 108. The concave portions 120 are positioned along the direction in which the wiring film extends. A covering film 110 is formed on the first conductive film 108 and the first insulating film 10 so as to be embedded in the concave portions 120. That is, the covering film 110 covers the surfaces of the upper end portions of the first barrier film 106 and the side surfaces of the insulating film 104 and the first conductive film 108. A second insulating film 20 which is formed on the covering film 110 includes a plurality of insulating films 111-114. A plurality of contact holes 115 are formed in the covering film 110 and the insulating films 111 and 112 on the upper surfaces of the first conductive film 108. A plurality of second trenches 116 are formed in the insulating films 112 and 113 of the second insulating film 20 so as to lead to the contact holes 115. Hereupon, a plurality of grooves may be formed in the second insulating film 20 instead of a plurality of the second trenches 116. A second barrier film 117 is formed on the upper surface of the first conductive film 108, sidewalls of the covering film 110 and the insulating films 111-114 in the contact holes 115 and the second trench 116. A second wiring film 118 is formed with itself embedded in the contact hole 115 and the trench 116. The second barrier film 117 and the second wiring film 118 comprise a second layer of wiring 119 of the semiconductor device.

FIGS. 2A-2H illustrate the processes for manufacturing the wirings structure of the semiconductor device as shown in FIG. 1.

Figure 2A:
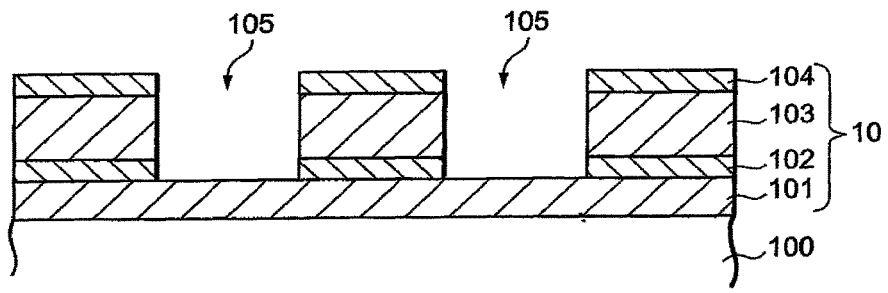
FIGS. 2A-2H illustrate processes of manufacturing the wirings structure of FIG. 1.

As shown in FIG. 2A, a plurality of circuit elements are formed after preparing the semiconductor substrate 100. Next, the first insulating film 10 is formed on the semiconductor substrate 100. As above-mentioned, the first insulating film 10 comprises a plurality of the insulating films 101-104. For example, the insulating film 101 is made of silicon oxide having a thickness of 500 nm, the insulating film 102 is made of silicon nitride having a thickness of 50 nm, the insulating film 103 is made of fluoridated silicon oxide having a thickness of 250 nm and the insulating film 104 is made of silicon oxide having a thickness of 50 nm. These insulating films 101-104 are deposited on the semiconductor substrate 100 by Chemical Vapor Deposition (hereinafter referred to as the "CVD") method. After that, a plurality of the first trenches 105 are formed at predetermined regions, on which the first conductive layer of wiring 109 will be formed, in the insulating films 102-104 of the first insulating film 10 by the known lithography and etching techniques. The first trench 105 has a width of 200 nm and a depth of 350 nm. In the process for forming the first trenches 105, the etching process is stopped after the etching of the insulating films 102-104. That is, since the insulating film 102 includes the silicon nitride which the insulating films 103 and 104 do not include, the insulating film 102 serves as an etching stopper film. Therefore, differences in depth among a plurality of the trenches 105 can be decreased. Also, even if there is a difference in thickness of the insulating films 103 and 104 in one semiconductor wafer, the depths of the first trenches 105 can be substantially equalized in the one semiconductor wafer. After etching the insulating films 103 and 104, the first trench 105 is formed by removing the insulating film 102 which is exposed from the insulating films 103 and 104.

Figure 2B:
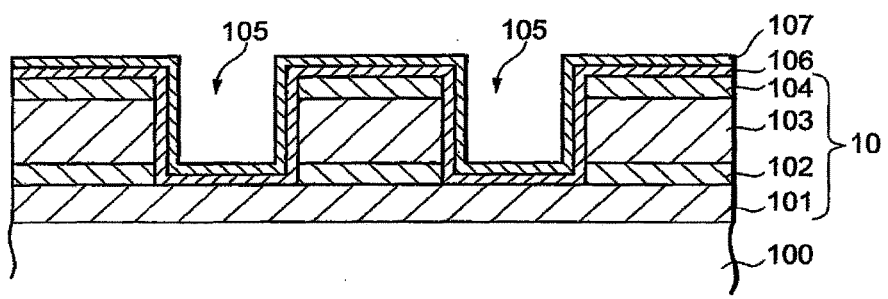

In the above-mentioned process for forming the first trenches 105, for example, one of several etching apparatuses, such as a magnetron reactive ion etching apparatus, a magnetron cathode coupled etching apparatus, a double frequency excitation capacitive coupling plasma etching apparatus, and an inductive coupled plasma etching apparatus, can be properly used. These etching apparatus can be properly used in the following etching processes. In the process for etching the insulating films 103 and 104, gases of octafluorocyclobutane ($C_4F_8$) gas, carbon monoxide (CO) gas, oxygen ($O_2$) gas and argon (Ar) gas are used. For example, the following is a preferable condition of the etching process for the insulating films 103 and 104:

(1) Gas Flow Rate: $C_4F_8$/CO/$O_2$/Ar=14/50/5/30 sccm
(2) Power of Radio Frequency: 1.5 kW
(3) Pressure in Chamber: 50 mTorr In the following process for etching the insulating film 102, $CHF_3$ gas and CO gas are used. For example, the following is a preferable condition of the etching process for the insulating film 102:

(1) Gas Flow Rate: $CHF_3$/CO=30/170 sccm
(2) Power of Radio Frequency: 1.5 kW
(3) Pressure in Chamber: 50 mTorr As shown in FIG. 2B, the first barrier film 106 is formed on the insulating film 104 of the first insulating film 10 and on a sidewall and a bottom surface of the first trenches 105. The first barrier film 106 serves as a diffusion suppressible film for material in the first conductive film 108. This first barrier film 106 is formed, for example, by depositing tantalum nitride (TaN) with a thickness of 50 nm by sputtering technique. In the process for forming the tantalum nitride film, the high directional sputtering technique can be performed, using a gas mixed argon and nitrogen as a process gas and tantalum as a sputtering target. For example, the following is a preferable condition of the sputtering process for the first barrier film 106:

(1) Pressure in Chamber: 3 mTorr
(2) Power of Direct Current: 6 kW
(3) Sputtering Temperature: 150 degrees C.

Also, the barrier film 106 improves the adhesiveness of the first wiring film 108 to be deposited in the trench 105. The followings are preferable materials as the first barrier film 106, for example, tantalum (Ta), titanium (Ti), titanium nitride (TiN), zirconium (Zr), zirconium nitride (ZrN), tungsten (W), tungsten nitride (WN), tantalum silicon nitride (TaSiN), titanium silicon nitride (TiSiN), zirconium silicon nitride (ZrSiN), and tungsten silicon nitride (WSiN).

Furthermore, a copper seed film 107 is formed on the surface of the first barrier film 106. The copper seed film 107 has a thickness of 150 nm and serves as a seed for a plating film. In the process for forming the copper seed film 107, the high directional sputtering technique can be performed, using an argon gas as a process gas and copper as a sputtering target. For example, the following is a preferable condition of the sputtering process for the copper seed film 107:

(1) Pressure in Chamber: 2 mTorr
(2) Power of Direct Current: 12 kW
(3) Sputtering Temperature: 30 degrees C.

The copper seed film 107 helps electron to move from the electrode in a peripheral region of the semiconductor wafer toward the central region of the semiconductor wafer. Also, the copper seed film 107 has a role as a nucleus for the growth of the plating film. Copper alloyed metal may be used as the seed film for plating, too.

Figure 2C:
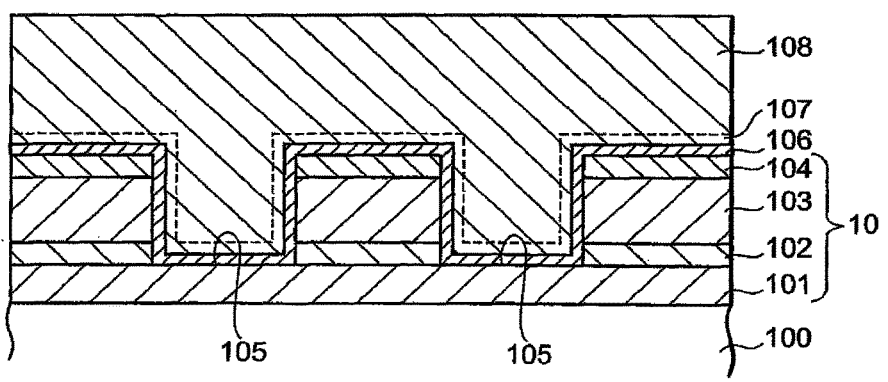

As shown in FIG. 2C, by electroplating, the first conductive film 108 including copper or copper alloyed metal is deposited so as to be embedded in the first trench 105. Hereupon, at first, the first conductive film 108 is deposited on the copper seed film 107 so as to be thicker than the depth of the first trench 105. In this electroplating, the plating solution is used, including such as copper sulfate solution ($CuSO_4$-$5H_2O$) from which copper separates out, sulfuric acid ($H_2SO_4$) improving the conductivity of the plating solution, chlorine ($Cl_2$) promoting the luster of the high current density portion and the resolvability of the dissoluble anode (for example, copper including phosphorus), and additives improving the embedding property of the first conductive film 108. The electroplating technique is performed using the above-mentioned plating solution on condition that the temperature of the plating solution is 25 degrees centigrade and the current is constant. However, the current density is changed in first and second steps. The current density is set at 0.2 A/m$^2$ in the first step and at 2 A/m$^2$ in the second step. The reason why the current density is changed is following. That is, when the current density is set only high, there is the possibility that the void occurs in the trench 105 because the first conductive film 108 is deposited thicker at an upper portion of the first trench 105. On the other hand, provided the current density is set only low, the deposition rate of the first conductive film 108 decreases and the embedding of the first conductive film 108 in the first recess 105 takes more time.

After depositing the first conductive film 108, the thermal treatment is performed in the furnace. For example, the following is a preferable condition of the thermal treatment for the first conductive film 108:

(1) Temperature: 100-350 degrees C.
(2) Gases: Nitrogen ($N_2$) and Hydrogen ($H_2$)
(3) Time: 1-300 minutes Alternatively, the thermal treatment is performed, disposing the semiconductor wafer on the hot plate instead of using the furnace. The thermal treatment does not only help microscopic copper crystal grain of the first wiring film to grow on the copper seed film 107 but also improves the hardness, the crystalline degree and the resistivity of the first conductive film 108. In the following statement, the first conductive film 108 is referred to as itself by including the copper seed film 107.

Figure 2D:
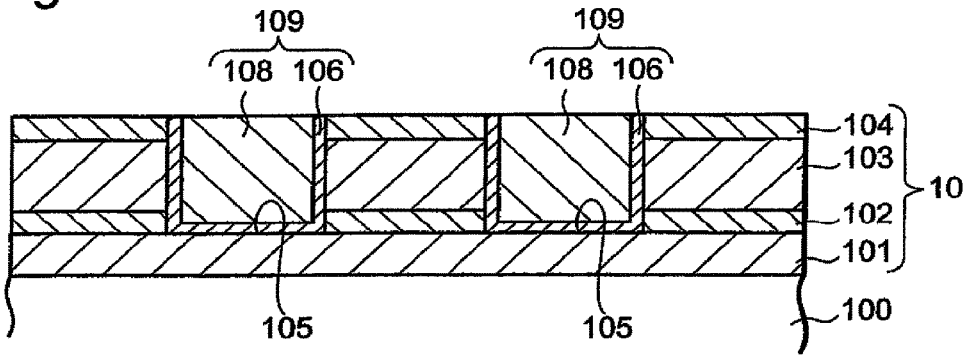

As shown in FIG. 2D, the first conductive film 108 and the first barrier film 106 are polished down to the insulating film 104 with the CMP method. That is, the first conductive film 108 and the first barrier film 106 are removed so that the surface of the insulating film 104 can be exposed and so that the first conductive film 108 and the first barrier film 106 can be embedded in the first trench 105. As the result, the first conductive film 108 and the first barrier film 106 are separated from each other and comprise the first conductive layer of wiring 109. The above-mentioned polish by the CMP method includes two steps. In the first step, the first conductive film 108 is polished and removed so that the first barrier film 106 can be exposed using the first barrier film 106 as a polishing stopper film. In the first step, slurry including the solution having silica as a polishing material, to which hydrogen peroxide is added as a copper complex forming accelerator can be used. A polishing pad has a laminated structure of nonwoven cloth and independent foam. For example, the following is a preferable condition of the polishing in the first step:

(1) Slurry Flow: 200 ml/min
(2) Polishing Load: 2 psi
(3) Revolution of Carrier Head: 120 rpm
(4) Revolution of Table: 120 rpm In the following second step of the polishing, the first barrier film 106 is polished and removed so that the surface of the insulating film 104 can be exposed and the first barrier film 106 can be embedded in the first trench 105. Hereupon, the insulating film 104 serves as a polishing stopper film. Also, in the second step, slurry including the solution having silica as a polishing material, to which hydrogen peroxide is added as a copper complex forming accelerator, can be used. Also, the polishing pad has a laminated structure of non-woven cloth and independent foam. For example, the following is a preferable condition of the polishing in the first step:

(1) Slurry Flow: 200 ml/min
(2) Polishing Load: 2 psi
(3) Revolution of Carrier Head: 80 rpm
(4) Revolution of Table: 80 rpm In addition, when the first conductive film 108 and the first barrier film 106 is planarized, it is preferable that the upper surface of the first conductive film 108 corresponds to the upper end portions of the first barrier film 106. In fact, when the first barrier film 106 is removed in the second polishing step, the upper surface of the first conductive film 108 is polished greater than the first barrier film 106 is done. Therefore, it can occur that the upper surface of the first conductive film 108 is approximately 5 nm-10 nm lower than the upper end portions of the first barrier film 106. However, as described later, since the concave portions 120 are formed between the first conductive film 108 and the insulating film 104 in the first trench 105 by making the upper end portions of the first barrier film 106 lower and the covering film 110 is embedded in the concave portions, the diffusion of copper ions and the growth of the copper hillock can be suppressed.

Figure 2E:
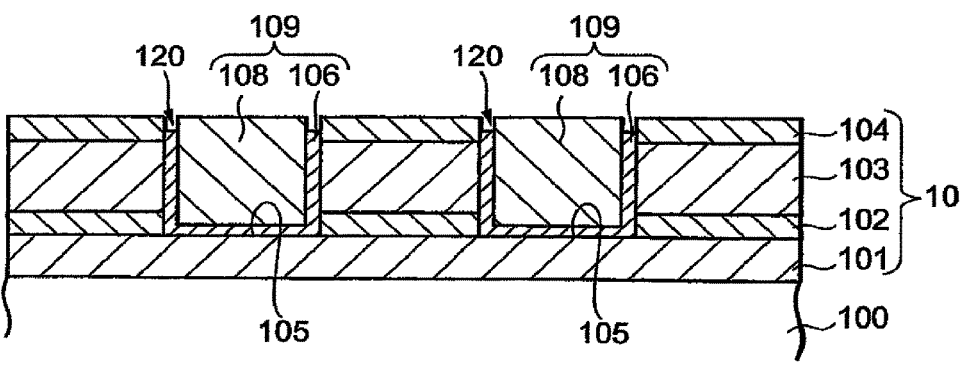
Figure 2F:
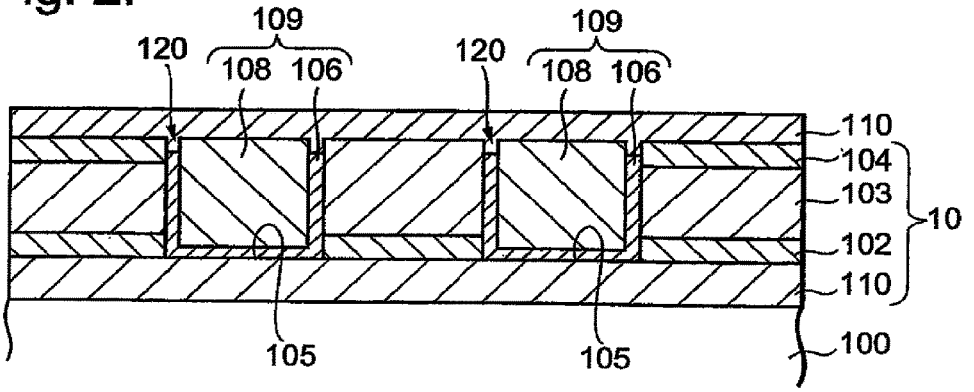

As shown in FIG. 2E, the upper portions of the first barrier film 106 are etched and removed by a wet etching process with chemicals or a dry etching process with gases so as to be lower than the upper surfaces of the insulating layer 104 and the first conductive film 108. Thus, the concave portions 120 are formed with the etched upper portions of the first barrier film 106, the sidewall of the first conductive film 108 and the sidewall of the insulating film 104 in the first trench 105. Hereupon, the etched upper portions of the first barrier film 106 are respectively 20 nm-30 nm lower than the upper surfaces of the insulating layer 104 and the first conductive film 108 so that the concave portions 120 can be easily filled with the covering film 110. For example, the following is a preferable condition of the dry etching:

(1) Gas Flow Rate: $Cl_2/BCl_3$=70/30 sccm
(2) Power of Radio Frequency: 1.2 kW
(3) Pressure in Chamber: 15 mTorr
(4) Power of Direct Current: 60 kW Next, as shown in FIG. 2F, the covering film 110 is formed on the insulating film 104, the upper surfaces of the first conductive film 108 and the etched upper surfaces of the first barrier films 106 so that the concave portions 120 can be properly filled with the covering film 110. Hereupon, the covering film 110 is deposited by the CVD method using silicon nitride having a thickness of 50 nm. The covering film 110 does not only suppress the diffusion of copper ions from the upper surface of the first conductive film 108 toward the upper surface of the insulating film 104 but also serves as an etching stopper for the patterning of the second insulating layer 20. For such occasions, one of silicon oxi-nitride, silicon carbide and a material having silicon carbide as a basis is used as the material of the covering film 110.

Figure 2G:
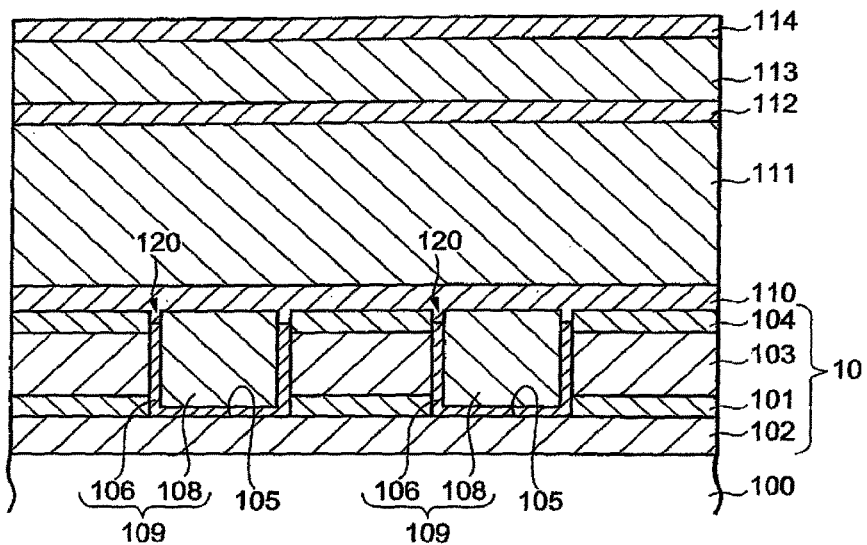
Figure 2H:
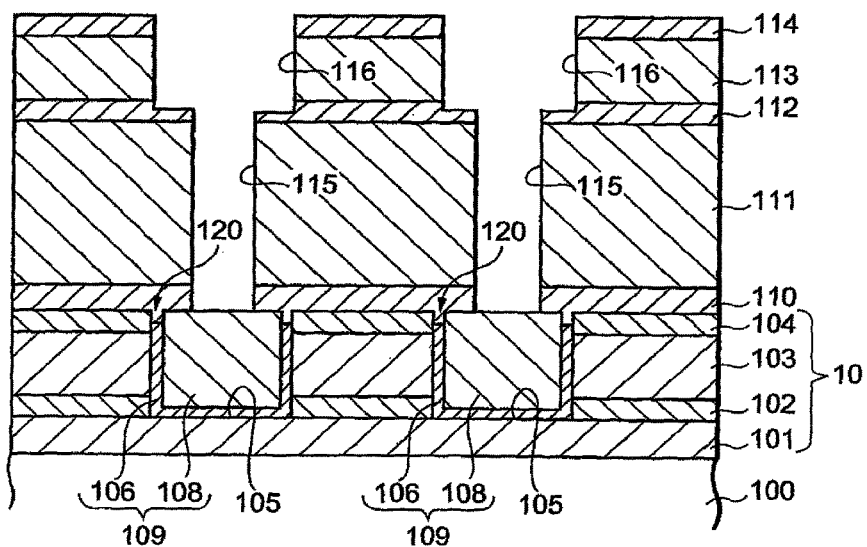

As shown in FIG. 2G, the second insulating film 20 is formed on the covering film 110 by the CVD method. The second insulating film 20 comprises a plurality of the insulating films 111-114. For example, the insulating film 111 is made of fluoridated silicon oxide having a thickness of 300 nm, the insulating film 112 is made of silicon nitride having a thickness of 50 nm, the insulating film 113 is made of fluoridated silicon oxide having a thickness of 250 nm, and the insulating film 114 is made of silicon oxide having a thickness of 50 nm. After that, as shown in FIG. 2H, the contact holes 115 and the second trenches 116 are formed in the second insulating film 20. Hereupon, a plurality of grooves may be formed in the first insulating film 20 instead of a plurality of the second trenches 116. Furthermore, the second barrier films 117 and the second conductive films 118 are embedded in the contact holes 115 and the trenches 116 as the first barrier films 106 and the first conductive film 108 already are. The second barrier films 117 and the second conductive films 118 comprise the second conductive layer of wiring 119. When forming further layers of wiring on the second conductive layer of wiring, the steps after the step as shown in FIG. 2E may be performed.

According to the first preferred embodiment, since the concave portions are formed between the first conductive film and the first insulating film by making upper portions of the first barrier film lower than the upper surface of the first wiring film and furthermore the covering film is not only formed on the first insulating film and the upper surface of the first conductive film but also embedded in the concave portions, it becomes difficult for the copper ions to migrate from the upper surface of the first wiring film toward the upper surface of the first insulating film. That is, the diffusion of the copper ions is suppressed from the upper surface of the first conductive film toward the upper surface of the first insulating film. The growth of the copper hillocks can be also suppressed. As the result, the possibility that the leakage current occurs between the adjacent first conductive films can be decreased.

Also, since the upper surface of the first conductive film is substantially as high as the upper surface of the first insulating film by removing the upper portions of the first barrier film whose thickness is much thinner than the width of the first conductive film, the degree of the steps in the second insulating film formed on the first insulating film and the first conductive film can be decreased. Therefore, the exact microfabrication can be realized in the upper layer of the semiconductor device, when the multi-level wirings structure is formed.

Second Preferred Embodiment

Figure 3:
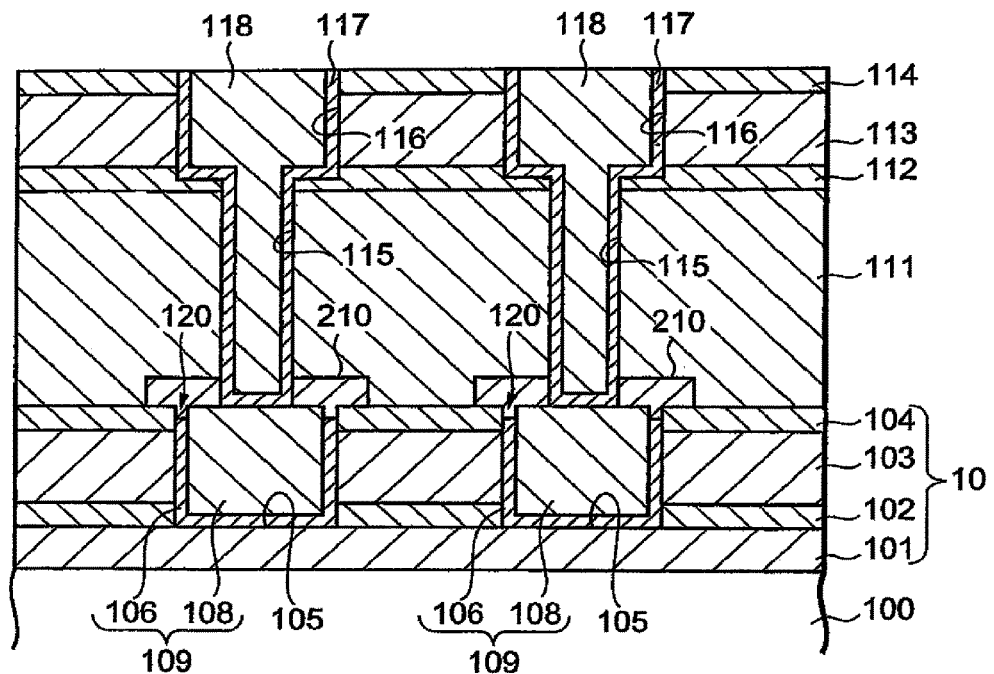
FIG. 3 is a cross sectional view describing a wiring structure of a semiconductor device according to a second preferred embodiment of the present invention.

FIG. 3 is a cross sectional view describing a wirings structure of a semiconductor device according to a second preferred embodiment of the present invention.

In the second preferred embodiment, the shape of the covering film is different from that according to the first preferred embodiment. The other shapes of the covering film according to the second preferred embodiment are the same as those according to the first preferred embodiment. That is, the covering film 210 according to the second embodiment is divided between the adjacent first conductive layers of wiring 109. That is, each of the covering films 210 is formed on each of the first conductive layers of wiring 109.

Figure 4:
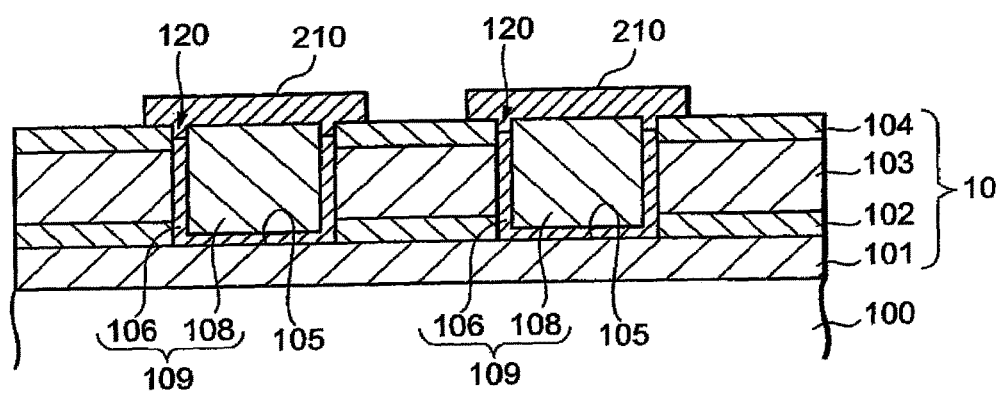
FIG. 4 illustrates one of the processes for manufacturing the wirings structure of the semiconductor device as shown in FIG. 3.

The manufacturing method of the semiconductor device according to the second preferred embodiment is described below. FIG. 4 illustrates one of the processes for manufacturing the wirings structure of the semiconductor device as shown in FIG. 3.

After the steps as shown in FIGS. 2A-2F, the covering film 210 including silicon nitride is patterned so as to be divided between the adjacent first conductive films 108 by the known lithography and etching techniques. That is, the upper surfaces of the first conductive films 108 and the concave portions 120 are covered with each of the covering films 210. In order to suppress the diffusion of the copper ions and the growth of the copper hillocks, one of silicon oxi-nitride, silicon carbide and a material having silicon carbide as a basis is used as the material of the covering film 210. Alternatively, since the covering film 210 is divided between the adjacent first conductive films 108, at least one of metal materials, that is, tantalum (Ta), titanium (Ti), zirconium (Zr), tungsten (W), cobalt (Co) and nickel (Ni), may be used as the material of the covering film 210. Furthermore, a silicon compound including at least one of the aforementioned metal materials may be used as the material of the covering film 210. After patterning the covering film 210, the insulating films 111-114, the contact holes 115, the second trenches 116, the second barrier films 117 and the second conductive films 118 are formed in sequence as described in FIGS. 2G and 2H.

According to the second preferred embodiment, as well as according to the first preferred embodiment, since the concave portions are formed between the first conductive film and the first insulating film by making upper portions of the first barrier film lower than the upper surface of the first conductive film and furthermore the covering film is not only formed on the first insulating film and the upper surface of the first conductive film but also embedded in the concave portions, the diffusion of the copper ions and the growth of the copper hillocks can be suppressed. As the result, the possibility that the leakage current occurs between the adjacent first conductive films can be decreased.

Also, because the relative permittivity of the silicon nitride is 7.0, the relative permittivity of the silicon carbide ranges 4 to 4.5, and the relative permittivity of the silicon oxide is 3.5, the relative permittivity of the covering film is higher than that of the insulating film which is between the first and second conductive layers of wirings. Therefore, when the area of the covering film is greater, the capacitance between the adjacent first conductive films or the capacitance between the wirings in the different layers increases. According to the second preferred embodiment, since the covering film is removed between the adjacent first conductive layers of wiring and the insulating film whose relative permittivity is lower than that of the covering film is formed in the region on which the covering film is removed, the capacitance between the adjacent first conductive films or the capacitance between the wirings in the different layers can be reduced.

On the other hand, when the covering film includes a conductive material, not only the capacitance between the adjacent first conductive films or the capacitance between the wirings in the different layers can be decreased but also the resistance properties of the electromigration can be improved.

Third Preferred Embodiment

Figure 5:
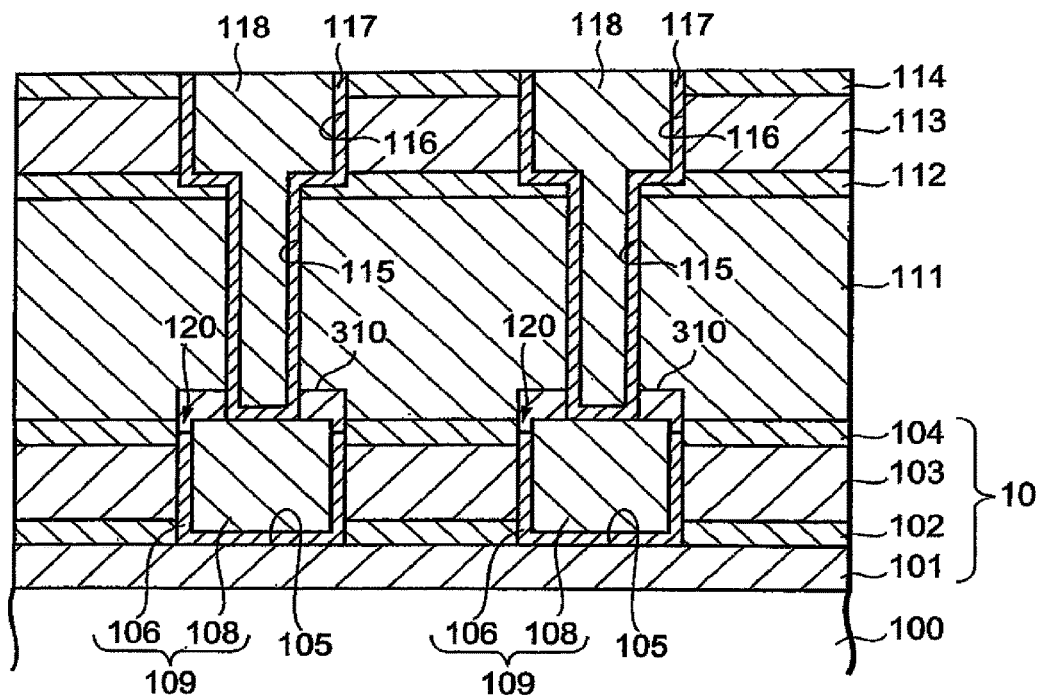
FIG. 5 is a cross sectional view describing a wiring structure of a semiconductor device according to a third preferred embodiment of the present invention.

FIG. 5 is a cross sectional view describing a wirings structure of a semiconductor device according to a third preferred embodiment of the present invention.

In the third preferred embodiment, the shape of the covering film is different from that according to the first preferred embodiment. The other shapes of the covering film according to the third preferred embodiment are the same as those according to the first preferred embodiment. That is, the covering film 310 according to the third embodiment is formed selectively on the upper surfaces of the first conductive layers of wiring 109. That is, the covering films 310 are formed on the first conductive layers of wiring 109 by an electroless plating.

Figure 6:
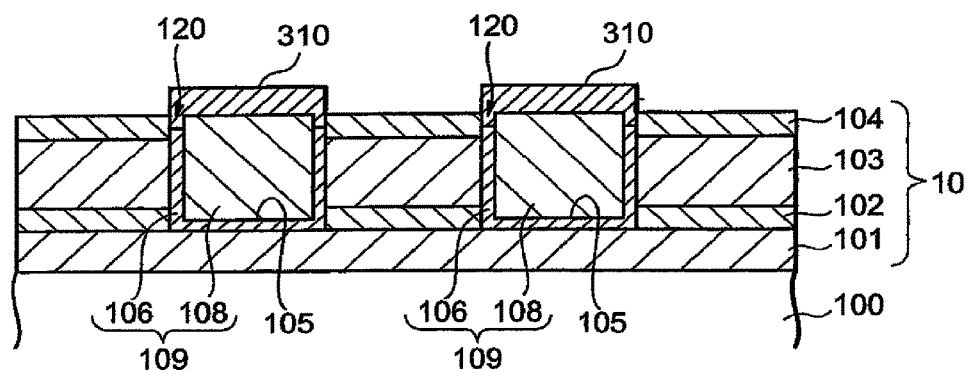
FIG. 6 illustrates one of the processes for manufacturing the wirings structure of the semiconductor device as shown in FIG. 5.

The manufacturing method of the semiconductor device according to the third preferred embodiment is described below. FIG. 6 illustrates one of the processes for manufacturing the wirings structure of the semiconductor device as shown in FIG. 5.

After the steps as shown in FIGS. 2A-2E, as seen in FIG. 6, the covering film 310 composed of a tungsten film with a thickness of 20 nm is formed on the first conductive layer of wiring 109 (the first barrier film 106 and the first conductive film 108) by the CVD method. Before forming the covering film 310, an oxide layer on the first conductive film 108 is removed by a thermal treatment performed in the atmosphere including hydrogen ($H_2$). For example, the following is a preferable condition of the thermal treatment for removing the oxide layer on the first conductive film 108:

(1) Substrate Temperature: 350 degrees C.
(2) Gas Flow of Hydrogen ($H_2$): 1000 sccm
(3) Gas Flow of Argon (Ar): 300 sccm
(4) Pressure: 1 Torr
(5) Time: 60-300 seconds Subsequently, with keeping a vacuum, the semiconductor wafer is transferred into the chamber. For example, the following is a preferable condition of forming of the covering film 310 composed of a tungsten film (1) Substrate Temperature: 200-300 degrees C.
(2) Gas Flow of Tungsten Fluoride ($WF_6$): 5 sccm
(3) Gas Flow of Hydrogen ($H_2$): 500 sccm
(4) Pressure: 300 Torr In addition, hereupon, the forming process for the covering film 310 composed of a tungsten film is performed in the different chamber from the chamber in which the thermal treatment for removing the oxide layer on the first conductive film 108 is performed. However, the forming process for the covering film 310 may be performed in the same chamber as the chamber in which the thermal treatment for removing the oxide layer. A conductive material including a metallic element can be used in the forming process for the covering film 310. That is, the material which can selectively cover a face of the first conductive film 108 may be used. A metallic material including cobalt (Co) as a basis, for example, one of cobalt (Co), phosphoric cobalt (CoP), phosphoric cobalt tungsten (CoPW) and phosphoric cobalt molybdenum (CoMoP) may be used. Alternatively, a metallic material including nickel (Ni) as a basis, for example, one of phosphoric nickel tungsten (NiWP) and phosphoric nickel molybdenum (NiMoP) may be used.

After patterning the covering film 310, the insulating films 111-114, the contact holes 115, the second trenches 116, the second barrier films 117 and the second wiring films 118 are formed in sequence as described in FIGS. 2G and 2H.

According to the third preferred embodiment, as well as according to the first and preferred embodiments, since the concave portions are formed between the first conductive film and the first insulating film by making upper portions of the first barrier film lower than the upper surface of the first conductive film and furthermore the covering film is not only formed on the first insulating film and the upper surface of the first conductive film but also embedded in the concave portions, the diffusion of the copper ions and the growth of the copper hillocks can be suppressed. As the result, the possibility that the leakage current occurs between the adjacent first conductive films can be decreased.

Furthermore, according to the third preferred embodiment, since the covering film is selectively formed on the first conductive layers of wiring by the electroless plating or CVD, the lithography and etching techniques for removing the covering film can be skipped. Therefore, the process for forming the wirings structure is simplified. As the result, the throughput in the process for forming the wirings structure can be improved.

Fourth Preferred Embodiment

Figure 7:
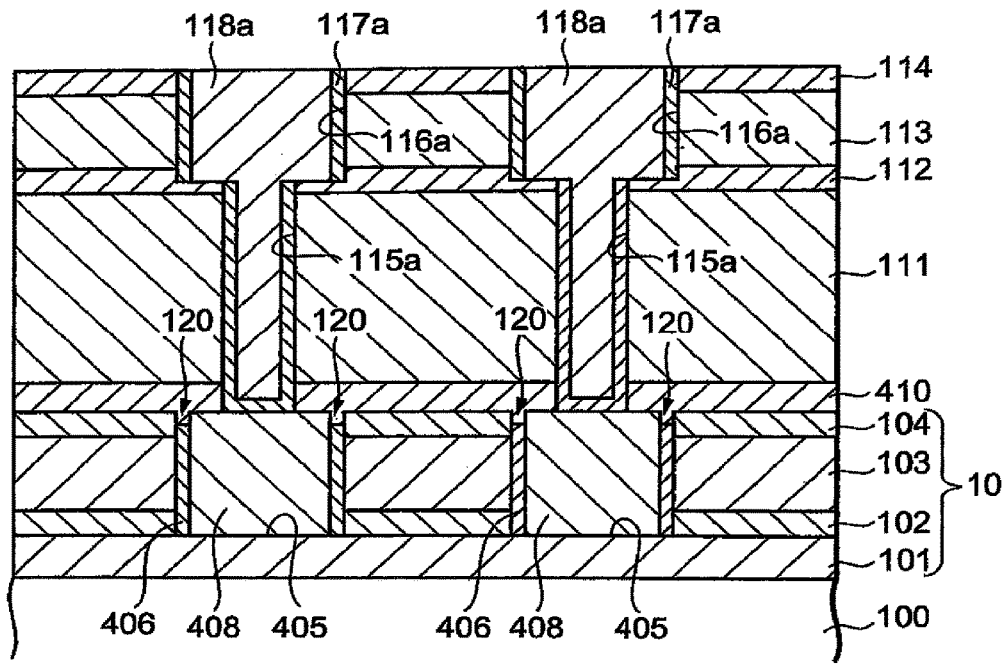
FIG. 7 is a cross sectional view describing a wirings structure of a semiconductor device according to a third preferred embodiment of the present invention.

FIG. 7 is a cross sectional view describing a wirings structure of a semiconductor device according to a third preferred embodiment of the present invention.

The difference between the fourth preferred embodiment and the aforementioned first to third preferred embodiments is described below. That is, a first barrier film 406 which is insulative is formed in the trench 405 instead of the first barrier film 406 according to the first to third preferred embodiments. Also, the width of the first conductive film 408 according to the fourth preferred embodiment is substantially same as the combined widths of the width of the first conductive film 108 and the double width of the first barrier film 106 according to the first preferred embodiment. Therefore, the width of the first trench 405 according to the fourth preferred embodiment is larger than that of the first trench 105 according to the first preferred embodiment by the double width of the first barrier film 406. The others than the aforementioned elements according to the fourth preferred embodiment are the same as those according to the first preferred embodiment.

The manufacturing method of the semiconductor device according to the fourth preferred embodiment is described below. FIGS. 8A-8F illustrate the processes for manufacturing the wirings structure of the semiconductor device as shown in FIG. 7.

After forming the first insulating film 10 as in the first preferred embodiment, the first trenches 405 are formed in the first insulating film 10. Hereupon, the trench 405 is formed wider than the trench 105 according to the first preferred embodiment by the double width of the first barrier film 406. That is, the first trench 405 is formed in the first insulating film 10 so that the width of the first conductive film 408 can be substantially same as the combined widths of the width of the first conductive film 108 and the double width of the first barrier film 106 according to the first preferred embodiment.

Figure 8A:
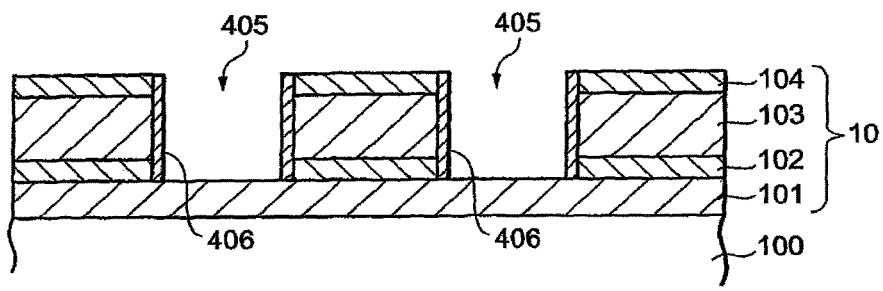
FIGS. 8A-8F illustrate the processes for manufacturing the wirings structure of the semiconductor device as shown in FIG. 7.

As shown in FIG. 8A, the first barrier film 406 is formed on the insulating film 104 of the first insulating film 10 and in the trench 405. After that, the first barrier film 406 is patterned with the first barrier film 406 removed on the insulating film 104 and on the bottom of the trench 405. As the result, the first barrier film 406 are left on the sidewalls of the first insulating film 10 in the trench 405. The first barrier film 406 includes the material which can suppress the diffusion of the copper ions or copper atoms from the first conductive film 408 toward the first insulating film 10. For such occasions, one of silicon oxi-nitride, silicon carbide and a material having silicon carbide as a basis is used as the material of the first barrier film 406.

Figure 8B:
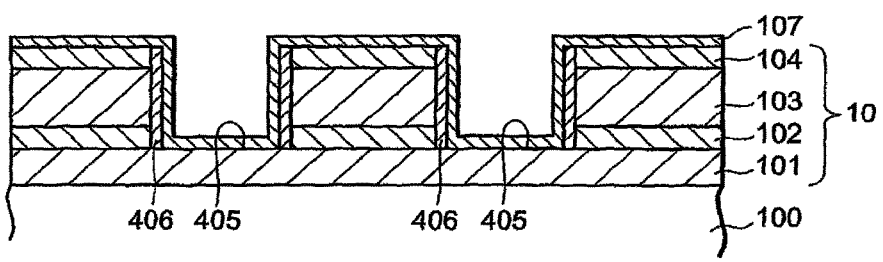
Figure 8C:
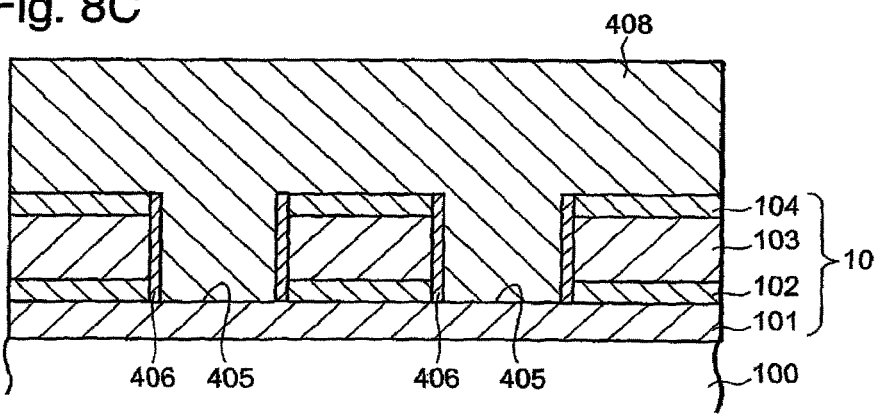
Figure 8D:
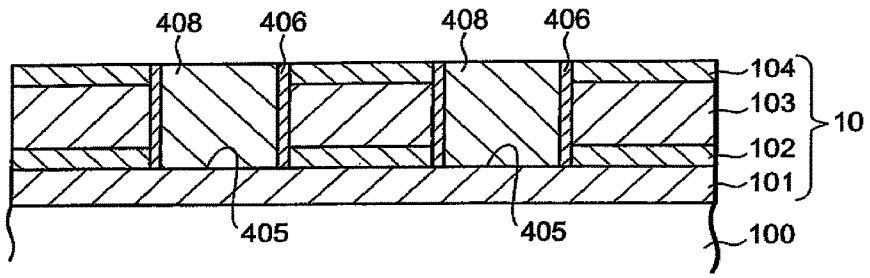

As shown in FIG. 8B, the copper seed film 107 is formed on the surfaces of the first insulating film 10 and the first barrier film 406 with a thickness of 150 nm. As shown in FIG. 8C, the first conductive film 408 including copper or copper alloyed metal is deposited so as to be embedded in the first trench 405. As shown in FIG. 8D, the first conductive film 408 is polished by the CMP method so as to be planarized. That is, the first conductive film 408 is removed so that the surface of the insulating film 104 can be exposed and the first conductive film 408 can be embedded in the first trench 405. Hereupon, the polishing process for the first conductive film 408 by the CMP method may be carried out as performed in the first preferred embodiment.

Figure 8E:
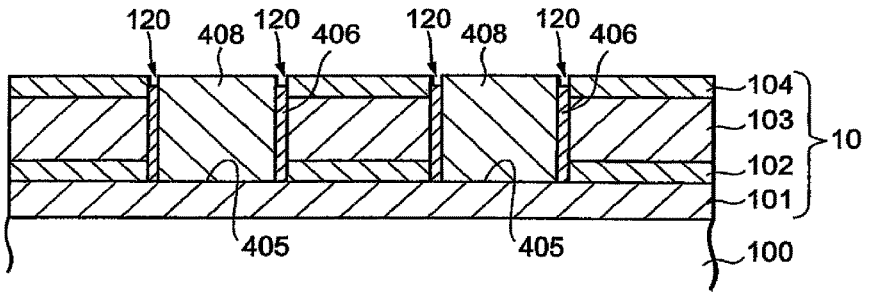
Figure 8F:
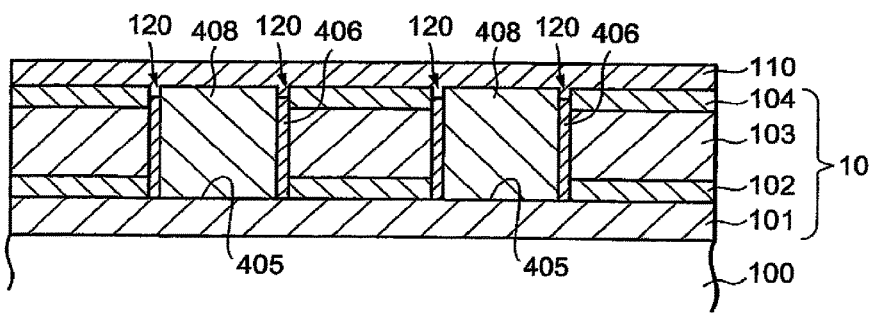

As shown in FIG. 8E, the upper portions of the first barrier film 406 are removed by a wet etching process with chemicals or a dry etching process with gases so as to be lower than the upper surfaces of the insulating layer 104 and the first conductive film 408. Thus, the concave portions 120 are formed with the etched upper portions of the first barrier film 406, the sidewall of the first conductive film 408 and the sidewall of the first insulating film 10 in the first trench 405. Next, as shown in FIG. 8F, the covering film 110 is formed on the insulating film 104, the upper surfaces of the first conductive films 408 and the etched upper surfaces of the first barrier film 406 so that the concave portions 120 can be properly filled with the covering film 110. Furthermore, as seen in FIG. 7, after forming the covering film 110, the insulating films 111-114, the contact holes 115, the second trenches 116, the second barrier films 117 and the second conductive films 118 are formed in sequence as formed in the first preferred embodiment.

According to the fourth preferred embodiment, since the concave portions are formed between the first conductive film and the first insulating film by making upper portions of the first barrier film lower than the upper surface of the first conductive film and furthermore the covering film is not only formed on the first insulating film and the upper surface of the first conductive film but also embedded in the concave portions, the diffusion of the copper ions and the growth of the copper hillocks can be suppressed as well as according to the first preferred embodiment.

Also, according to the fourth preferred embodiment, since the first trench is formed in the first insulating film so as to be larger than that of the first trench according to the first preferred embodiment by the double width of the first barrier film, the width of the first conductive film according to the fourth preferred embodiment can be substantially same as the combined widths of the width of the first conductive film and the double width of the first barrier film according to the first preferred embodiment. That is, since the first trench is embedded with the first conductive film without the conductive barrier film having a high value of resistance, the effective value of resistance of the first conductive layers of wiring can be reduced.

Fifth Preferred Embodiment

Figure 9:
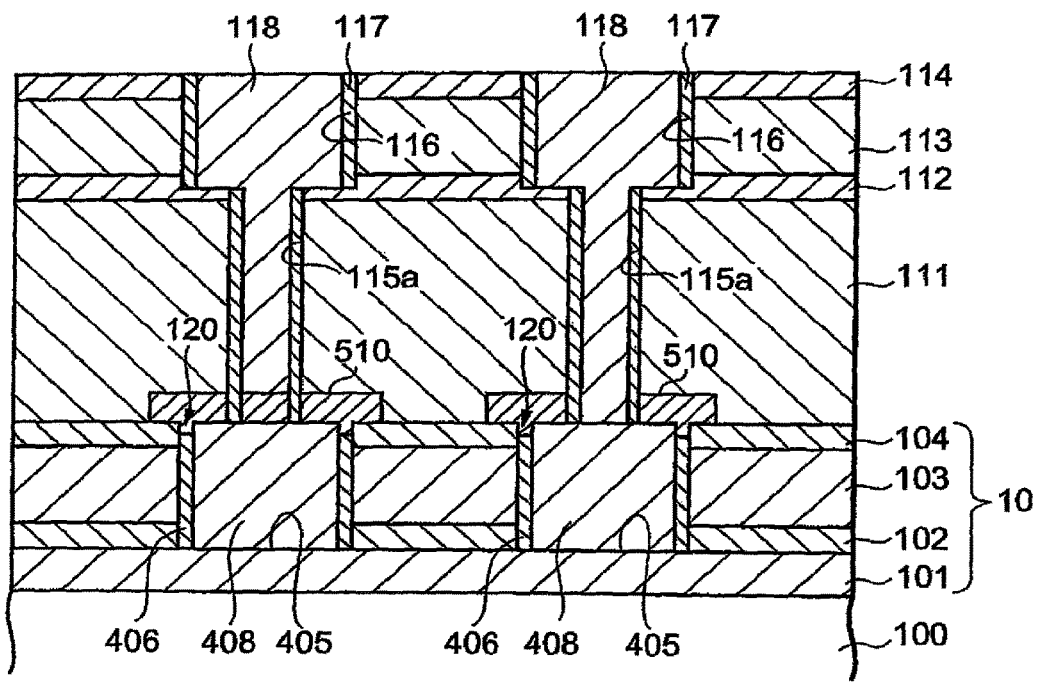
FIG. 9 is a cross sectional view describing a wirings structure of a semiconductor device according to a fifth preferred embodiment of the present invention.

FIG. 9 is a cross sectional view describing a wirings structure of a semiconductor device according to a fifth preferred embodiment of the present invention.

In the fifth preferred embodiment, the shape of the covering film is different from that according to the fourth preferred embodiment. The other shapes of the covering film according to the fifth preferred embodiment are the same as those according to the fourth preferred embodiment. That is, the covering film 510 according to the second embodiment is divided between the adjacent first conductive film 408. That is, each of the covering films 510 are respectively formed on each of the first conductive film 408.

Figure 10:
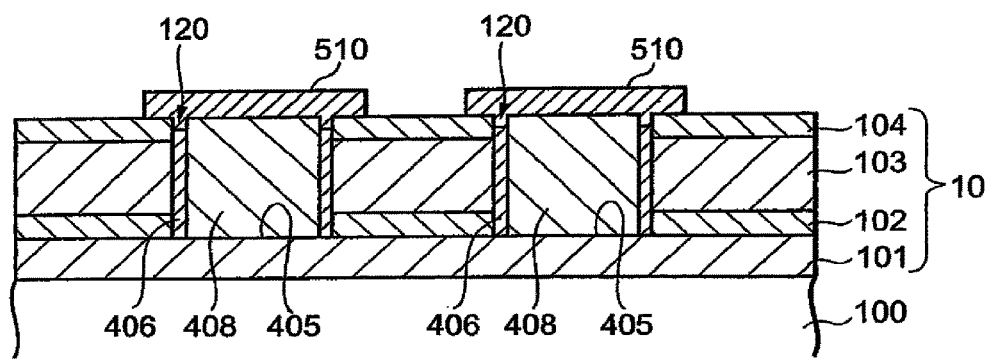
FIG. 10 illustrates one of the processes for manufacturing the wirings structure of the semiconductor device as shown in FIG. 9.

The manufacturing method of the semiconductor device according to the fifth preferred embodiment is described below. FIG. 10 illustrates one of the processes for manufacturing the wirings structure of the semiconductor device as shown in FIG. 9.

After the steps as shown in FIGS. 8A-8E, the covering film 510 including silicon nitride is patterned so as to be divided between the adjacent first conductive films 408 by the known lithography and etching techniques as shown in FIG. 10. That is, the upper surface of the first conductive film 408 and the concave portions 120 are covered with each of the covering films 510. In order to suppress the diffusion of the copper ions and the growth of the copper hillocks, one of silicon oxi-nitride, silicon carbide and a material having silicon carbide as a basis is used as the material of the covering film 510. Alternatively, since the covering film 510 is divided between the adjacent first conductive films 408, at least one of metal materials, that is, tantalum (Ta), titanium (Ti), zirconium (Zr), tungsten (W), cobalt (Co) and nickel (Ni), may be used as the material of the covering film 510. Furthermore, a silicon compound including at least one of the aforementioned metal materials may be used as the material of the covering film 510. After patterning the covering film 510, the insulating films 111-114, the contact holes 115, the second recesses 116, the second barrier films 117 and the second conductive films 118 are formed in sequence as described in FIG. 9.

According to the fifth preferred embodiment, the effects can be realized as well as according to the fourth preferred embodiment.

Also, because the relative permittivity of the silicon nitride is 7.0, the relative permittivity of the silicon carbide ranges 4 to 4.5, and the relative permittivity of the silicon oxide is 3.5, the relative permittivity of the covering film is higher than that of the insulating film which is between the first and second conductive layers of wirings. Therefore, when the area of the covering film is greater, the capacitance between the adjacent first conductive films or the capacitance between the wirings in the different layers increases. According to the second preferred embodiment, since the covering film is removed between the adjacent first conductive layers of wiring and the insulating film whose relative permittivity is lower than that of the covering film is formed in the region on which the covering film is removed, the capacitance between the adjacent first conductive films or the capacitance between the wirings in the different layers can be reduced.

Sixth Preferred Embodiment

Figure 11:
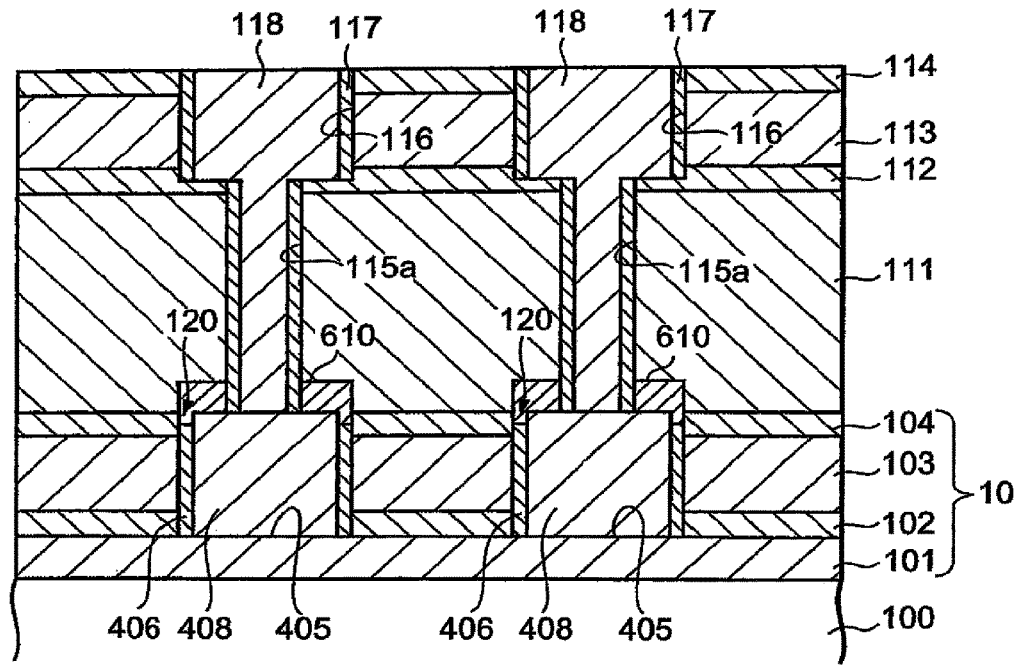
FIG. 11 is a cross sectional view describing a wirings structure of a semiconductor device according to a third preferred embodiment of the present invention.

FIG. 11 is a cross sectional view describing a wirings structure of a semiconductor device according to a third preferred embodiment of the present invention.

In the third preferred embodiment, the shape of the covering film is different from that according to the fourth preferred embodiment. The other shapes of the covering film according to the sixth preferred embodiment are the same as those according to the fourth preferred embodiment. That is, the covering film 610 according to the third embodiment is formed selectively on the upper surfaces of the first conductive film 408. That is, the covering films 610 are formed on the first barrier film 406 and the first conductive film 408 by an electroless plating or a selective CVD.

Figure 12:
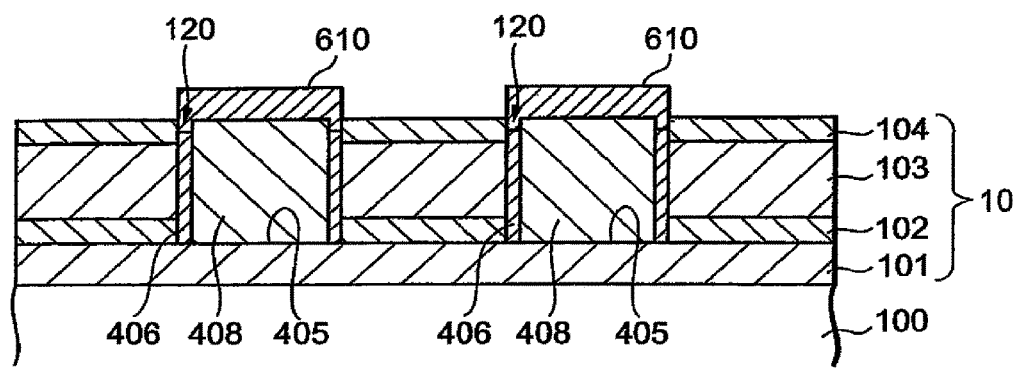
FIG. 12 illustrates one of the processes for manufacturing the wirings structure of the semiconductor device as shown in FIG. 11.

The manufacturing method of the semiconductor device according to the sixth preferred embodiment is described below. FIG. 12 illustrates one of the processes for manufacturing the wirings structure of the semiconductor device as shown in FIG. 11.

After the steps as shown in FIGS. 8A-8E, as seen in FIG. 11, the covering film 610 composed of a tungsten film with a thickness of 20 nm is formed on the upper surface and a portion of the sidewall surface of the first conductive film 408 by the CVD method. Before forming the covering film 610, an oxide layer on the first conductive film 408 is removed by a thermal treatment performed in the atmosphere including hydrogen ($H_2$). For example, the following is a preferable condition of the thermal treatment for removing the oxide layer on the first conductive film 408:

(1) Substrate Temperature: 350 degrees C.
(2) Gas Flow of Hydrogen ($H_2$): 1000 sccm
(3) Gas Flow of Argon (Ar): 300 sccm
(4) Pressure: 1 Torr
(5) Time: 60-300 seconds Subsequently, with keeping a vacuum, the semiconductor wafer is transferred into the chamber. For example, the following is a preferable condition of forming of the covering film 610 composed of a tungsten film (1) Substrate Temperature: 200-300 degrees C.
(2) Gas Flow of Tungsten Fluoride ($WF_6$): 5 sccm
(3) Gas Flow of Hydrogen ($H_2$): 500 sccm
(4) Pressure: 300 Torr In addition, hereupon, the forming process for the covering film 310 composed of a tungsten film is performed in the different chamber from the chamber in which the thermal treatment for removing the oxide layer on the first conductive film 408 is performed. However, the forming process for the covering film 610 may be performed in the same chamber as the chamber in which the thermal treatment for removing the oxide layer. A conductive material including a metallic element can be used in the forming process for the covering film 610. That is, the material which can selectively cover a face of the first conductive film 408 may be used. A metallic material including cobalt (Co) as a basis, for example, one of cobalt (Co), phosphoric cobalt (CoP), phosphoric cobalt tungsten (CoPW) and phosphoric cobalt molybdenum (CoMoP) may be used. Alternatively, a metallic material including nickel (Ni) as a basis, for example, one of phosphoric nickel tungsten (NiWP) and phosphoric nickel molybdenum (NiMoP) may be used.

After patterning the covering film 610, the insulating films 111-114, the contact holes 115, the second trenches 116, the second barrier films 117 and the second conductive films 118 are formed in sequence as described in FIG. 11.

According to the fifth preferred embodiment, the effects can be realized as well as according to the fourth preferred embodiment. Also, since the covering film includes a conductive material, not only the capacitance between the adjacent first conductive films or the capacitance between the wirings in the different layers can be decreased but also the resistance properties of the electromigration can be improved as well as the fifth preferred embodiment.

Furthermore, according to the sixth preferred embodiment, since the covering film is selectively formed on the first conductive layers of wiring by the electroless plating or CVD, the lithography and etching techniques for removing the covering film can be skipped. Therefore, the process for forming the wirings structure is simplified. As the result, the throughput in the process for forming the wirings structure can be improved.

What is claimed is:

1. A wiring structure in a semiconductor device that includes a semiconductor substrate, a first insulating layer formed on a first upper surface of the semiconductor substrate with a first trench formed therein and exposing an inner surface of the first insulating layer and a first barrier film that has a second upper surface and is formed on the inner surface of the first insulating layer, the wiring structure comprising:

a first conductive film that has a third upper surface and a side wall contacting the first barrier film inside the first trench;

a second insulating layer that has a fourth upper surface and a second trench formed at the fourth upper surface;

a second barrier film that has a fifth upper surface and is formed on the inside wall of the second trench;

a second conductive film that has a sixth upper surface and a side wall contacting the second barrier film inside the second trench;

a third insulating layer arranged between the first conductive film and the second conductive film; and a third trench formed to penetrate the third insulating layer and connecting the first conductive film and the second conductive film electrically, wherein the third trench includes a third barrier film and a third conductive film formed integrally with the second barrier film and the second conductive film, respectively, at least a portion of the third trench has a depth that is greater than a depth of the first trench, a width of the third trench is narrower than a width of the first conductive film inside the first trench, the third insulating layer includes a covering film that covers and directly contacts the second upper surface and the third upper surface, and the third trench penetrates through the covering film such that the third barrier film contacts the first conductive film, wherein the covering film and the third insulating layer comprise different respective materials, and wherein a thickness of the third barrier film that is in contact with the first conductive film is less than a thickness of the covering film.

2. The wiring structure according to claim 1, wherein the first conductive film and the second conductive film comprise a copper wiring or a copper alloy.

3. The wiring structure according to claim 1, wherein a height from a bottom surface of the first trench to the first upper surface and a height from the bottom surface of the first trench to the third upper surface are greater than a height from the bottom surface of the first trench to the second upper surface.

4. The wiring structure according to claim 1, wherein the covering film is an etching-stopper.

5. The wiring structure according to claim 1, wherein the covering film suppresses diffusion from the first conductive film to the first insulating film.

6. The wiring structure according to claim 1, wherein the covering film covers the entire surface of the second upper surface, and covers a portion of the third upper surface, but does not cover the first upper surface.

7. The wiring structure according to claim 1, wherein the thickness of the covering film is greater than a thickness of the first barrier film.

8. The wiring structure according to claim 1, wherein the covering film comprises silicon carbide.

9. The wiring structure according to claim 1, wherein the covering film comprises silicon oxi-nitride.

10. The wiring structure according to claim 1, wherein the covering film comprises silicon nitride.

11. A wiring structure in a semiconductor device that includes a semiconductor substrate, a first insulating layer formed on a first upper surface of the semiconductor substrate with a first trench formed therein and exposing an inner surface of the first insulating layer and a first barrier film that has a second upper surface and is formed on the inner surface of the first insulating layer, the wiring structure comprising:

a first conductive film that has a third upper surface and a side wall contacting the first barrier film inside the first trench;

a second insulating layer that has a fourth upper surface and a second trench formed at the fourth upper surface;

a second barrier film that has a fifth upper surface and is formed on the inside wall of the second trench;

a second conductive film that has a sixth upper surface and a side wall contacting the second barrier film inside the second trench;

a third insulating layer formed between the first conductive film and the second conductive film; and a third trench formed to penetrate the third insulating layer and connecting the first conductive film and the second conductive film electrically, wherein the third trench includes a third barrier film and a third conductive film formed integrally with the second barrier film and the second conductive film, respectively, at least a portion of the third trench has a depth that is greater than a depth of the first trench, a width of the third trench is narrower than a width of the first conductive film inside the first trench, the third insulating layer includes a covering film that covers the second upper surface and the third upper surface, and the third trench penetrates the covering film such that the third barrier film contacts the first conductive film, wherein the covering film and the third insulating layer comprise different respective materials, and wherein the second upper surface of the first barrier film is positioned lower than the third upper surface of the first conductive film.

12. A semiconductor substrate including a main surface, the semiconductor substrate comprising:

a first insulating layer positioned above the main surface;

a first barrier film;

a first conductive film including a first upper surface, a first side surface and a first lower surface, the first side surface and the first lower surface contacting the first insulating layer via a first barrier film;

a covering film positioned on and contacting the first upper surface;

a second insulating layer positioned above the first insulating layer;

a second barrier film; and a second conductive film including a first portion that penetrates through the covering film and a second portion above the first portion, wherein the first portion includes a second lower surface that contacts the first upper surface via the second barrier film and a second side surface that contacts the second insulating layer via the second barrier film, a lower surface and a side surface of the second portion contact the second insulating layer via the second barrier film, in a cross sectional view, a width of the first conductive film is larger than a width of the first portion, and a thickness of the second barrier film contacting the first upper surface is less than a thickness of the covering film.

* * * * *